US007662538B2

(12) United States Patent
Sheehan et al.

(10) Patent No.: US 7,662,538 B2
(45) Date of Patent: Feb. 16, 2010

(54) DERIVATIZED POLYHYDROXYSTYRENES (DPHS) WITH A NOVOLAK TYPE STRUCTURE AND BLOCKED DPHS (BDPHS) AND PROCESSES FOR PREPARING THE SAME

(75) Inventors: Michael T. Sheehan, Corpus Christi, TX (US); Edward G. Zey, Corpus Christi, TX (US); Hiroshi Okazaki, Corpus Christi, TX (US)

(73) Assignee: Du Pont Electronic Polymers L.P., Research Triangle Park, NC (US)

( * ) Notice: Subject to any disclaimer, the term of this patent is extended or adjusted under 35 U.S.C. 154(b) by 289 days.

(21) Appl. No.: 11/250,014

(22) Filed: Oct. 13, 2005

(65) Prior Publication Data

US 2006/0099531 A1     May 11, 2006

(51) Int. Cl.
*G03F 7/039*     (2006.01)
(52) U.S. Cl. ..................... 430/270.1; 525/79
(58) Field of Classification Search ........................ None
See application file for complete search history.

(56) References Cited

U.S. PATENT DOCUMENTS

| 5,494,967 | A | * | 2/1996 | Brod et al. | .................. | 525/222 |
| 5,554,719 | A | * | 9/1996 | Sounik | ........................ | 528/212 |
| 5,641,604 | A | * | 6/1997 | Sinta et al. | .................. | 430/192 |
| 2001/0053496 | A1 | * | 12/2001 | Adams | ..................... | 430/270.1 |
| 2003/0050411 | A1 | * | 3/2003 | Gaynor et al. | ................. | 526/90 |
| 2004/0176655 | A1 | * | 9/2004 | Ayoub et al. | ................. | 585/324 |
| 2005/0250042 | A1 | * | 11/2005 | Sheehan et al. | .......... | 430/270.1 |

FOREIGN PATENT DOCUMENTS

| WO | WO 9700278 A1 * | 1/1997 |
| WO | WO 9700465 A1 * | 1/1997 |
| WO | WO 2005113634 A1 * | 12/2005 |
| WO | WO 2006052380 A1 * | 5/2006 |

OTHER PUBLICATIONS

Kroeker et al J. Am. Chem So. 1999,121, 1582-1590.*
Zhang et al , Chem. Commun., 2002, pp. 2862-28-63, Royal Society of Chemistry, www.rsc.org/chemcomm.*
"Molecular Weight", from http://www.pslc.ws/mactest/weight.htm, 6 pages printed out on Jul. 29, 2005.*
Kaufman et al (eds) ,Introduction to Polymer Science and TEchnology: An SPE Textbook, A wiley-Interscience Pubilcation, New York, N.Y. 1977 (no month given) (John Wiley & Sons, Inc., CHapter 4, pp. 162-197.*

* cited by examiner

*Primary Examiner*—Cynthia Hamilton
(74) *Attorney, Agent, or Firm*—James J. Mullen

(57) ABSTRACT

A process for preparing a blocked derivatized poly(4-hydroxystryrene)-DPHS having a novolak type structure which comprises the steps of (i) supplying a solution of methanol containing 4-hydroxyphenylmethylcarbinol, (ii) subjecting said solution to an acid catalyzed displacement reaction for a sufficient period of time and under suitable conditions of temperature and pressure to convert substantially all of said carbinol to 4-hydroxyphenylmethylcarbinol methyl ether in solution, (iii) polymerizing said ether containing solution in the presence of a suitable acid catalyst for a sufficient period of time and under suitable conditions of temperature and pressure to form a novolak type polymer; and (iv) reacting said polymer with a vinyl ether, a dialkyl dicarbonate, or a mixture of vinyl ether and a dialkyl dicarbonate to form the blocked DPHS. New compositions of matter which comprise the blocked derivatized poly(4-hydroxystyrene) prepared in the above manner and which have application in the electronic chemicals market such as in a photoresist composition and MEMS, and in other areas such as in varnishes, printing inks, epoxy resins, copying paper, tackifiers for rubber, crude oil separators, toner resins for photocopying, antireflective coatings, and the like.

5 Claims, No Drawings

DERIVATIZED POLYHYDROXYSTYRENES (DPHS) WITH A NOVOLAK TYPE STRUCTURE AND BLOCKED DPHS (BDPHS) AND PROCESSES FOR PREPARING THE SAME

BACKGROUND OF THE INVENTION

1. Field of the Invention

The present invention relates to a new derivatized poly(4-hydroxystyrene) (DPHS) and blocked DPHS (BDPHS) and a process for the production of DPHS indirectly from 4-hydroxymethyl-carbinol (HPMC) and which DPHS and BDPHS have a novolak type structure which has utility in the electronic chemicals market such as photoresist compositions. In addition to the use of DPHS and BDPHS in the microelectronic chemicals market, such DPHS can be employed in standard novolak applications such as varnishes, aniline printing inks, raw materials (e.g. curing agents) for epoxy resins, copying paper, tackifiers for rubber, crude oil separators, solder masks and photoimageable coverlays for rigid and flexible printed circuit boards, and further, derivatized epoxy resins and polyisocyanuates which have been reacted with the hydroxy groups of the DPHS and/or BDPHS, such as paint formulations containing the same. The DPHS and/or BDPHS may also be used as a viscosity modifier for highly viscous polymers with the capability of crosslinking after casting and thus providing antioxidation protection therefore. Other applications include MEMS, micro electromechanical systems, such as described in U.S. Pat. No. 6,801,682

2. Description of the Prior Art

In the past, one of the ways of preparing poly(4-hydroxystyrene) (PHS) was the use of 4-hydroxystyrene (HSM) as the starting material; note European Patent Application No. 0-108-624. 4-Hydroxystyrene is a well-known compound in the art.

Although there are several known ways to prepare 4-hydroxystyrene, these known methods are not commercially feasible in the further utilization of the 4-hydroxystyrene. The 4-hydroxystyrene itself is difficult to isolate since it (1) readily decomposes, and (2) is toxic via skin absorption and, as a result, those skilled in the art have made numerous attempts at finding a method of synthesizing PHS in a manner which avoids using the 4-hydroxystyrene as the starting material.

The following prior art references are disclosed for informational purposes.

U.S. Pat. No. 5,087,772 (issued Feb. 11, 1992) discloses the preparation of HSM by reacting 4-acetoxystyrene (ASM) with a suitable alcohol in the presence of a catalytic amount of a suitable base.

U.S. Pat. No. 5,340,687 discloses the alkylation of a linear poly(4-hydroxystyrene).

European Patent Application No. 0-128-984 (publication no.) filed Aug. 30, 1983 discloses a process for the production of para-vinyl phenol (HSM) by dehydrogenation of paraethyl phenol.

European Patent Application No. 0-108-624 (publication no.) filed Nov. 4, 1983, discloses a process for the production of p-vinyl phenol polymer (poly(4-hydroxystyrene) polymer—PHS) by polymerizing p-vinyl (HSM) in the presence of water and iron.

U.S. Pat. No. 4,032,513 (issued Jun. 28, 1977) discloses a process of producing PHS by cationically polymerizing HSM in the presence of a nitrile such as $CH_3CN$ using a cationic polymerization initiator in a homogeneous reaction system.

U.S. Pat. Nos. 5,554,719 and 5,565,544 disclose a process for preparing a branched PHS directly from HPMC which comprises the single step of polymerizing a mixture of carboxylic acid and at least one substituted phenyl carbinol such as HPMC.

However, it is highly desirable to have a linear DPHS and a blocked linear DPHS and the prior art does not disclose this, much less a process for preparing the same.

Other prior art references which relate to the present invention include U.S. Pat. Nos. 2,276,138; 3,547,858, 4,544,704; 4,678,843; 4,689,371; 4,822,862; 4,857,601; 4,868,256; 4,877,843; 4,898,916; 4,912,173; 4,962,147; and 4,965,400.

All of the above-cited prior art and any other references mentioned herein are incorporated herein by reference in their entirety.

SUMMARY OF THE INVENTION

The present invention, in part, discloses a new derivatized poly(4-hydroxystyrene) (DPHS) of the structural formula set forth herein and which DPHS is uniquely linear in character. Another aspect of the present invention is a process for preparing a derivatized poly(4-hydroxystyrene) (DPHS) having a novolak type structure which comprises the steps of (i) supplying a solution of methanol containing HPMC, (ii) subjecting said solution to an acid catalyzed displacement reaction for a sufficient period of time and under suitable conditions of temperature and pressure to convert substantially all of said HPMC to 4-hydroxyphenylmethylcarbinol methyl ether in said solution, and (iii) polymerizing said ether containing solution in the presence of a suitable acid catalyst for a sufficient period of time and under suitable conditions of temperature and pressure to form a novolak type polymer which is a unique and new DPHS polymeric material having a molecular weight of from about 1,000 to about 100,000, preferably from about 1,000 to about 50,000 and more preferably from about 1,000 to about 10,000. One of the most important characteristics of the new DPHS is the fact that it is substantially linear (about 5% to about 40% weight percent) compared to the prior art PHS as determined by NMR, and has a low polydispersity, i.e. less than about 2.0.

Another part of the present invention is directed to the blocked (or protected) DPHS, herein referred to as BDPHS, and which is a new composition of matter. This BDPHS is prepared by the process of reacting the DPHS with a vinyl ether compound and/or a dialkyl dicarbonate in the presence of a catalyst in an aprotic solvent under suitable reaction conditions to form said BDPHS.

DETAILED DESCRIPTION OF THE INVENTION

The present invention provides, in part, a new derivatized poly(4-hydroxystyrene) (DPHS) and blocked DPHS having the following structures:

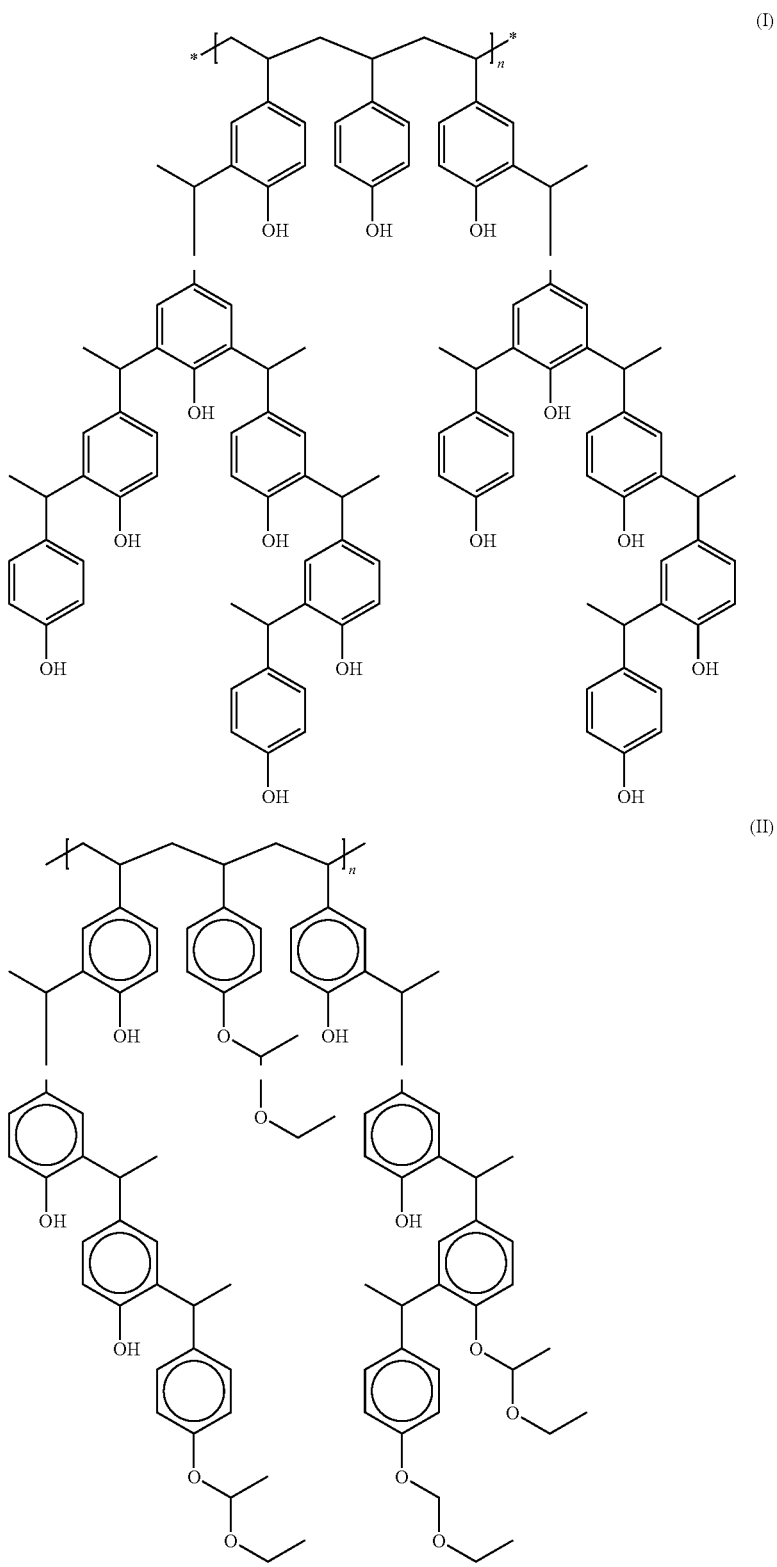

-continued

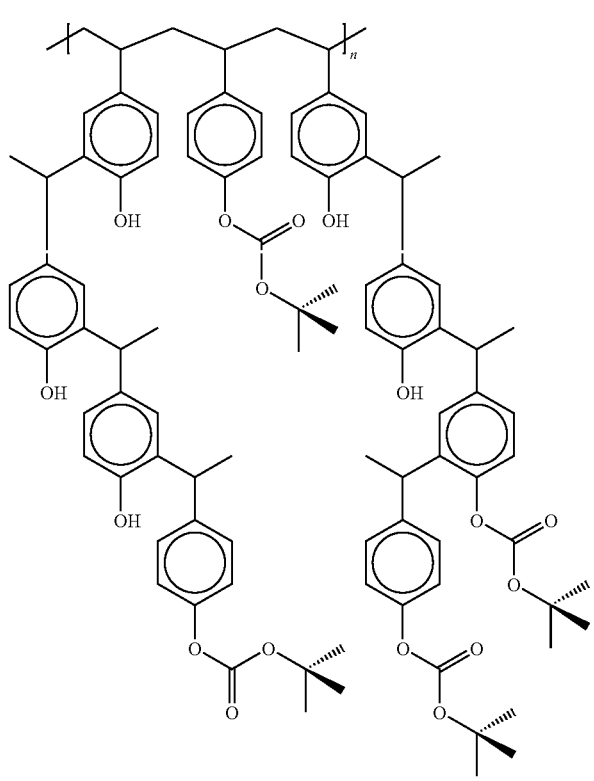

(III)

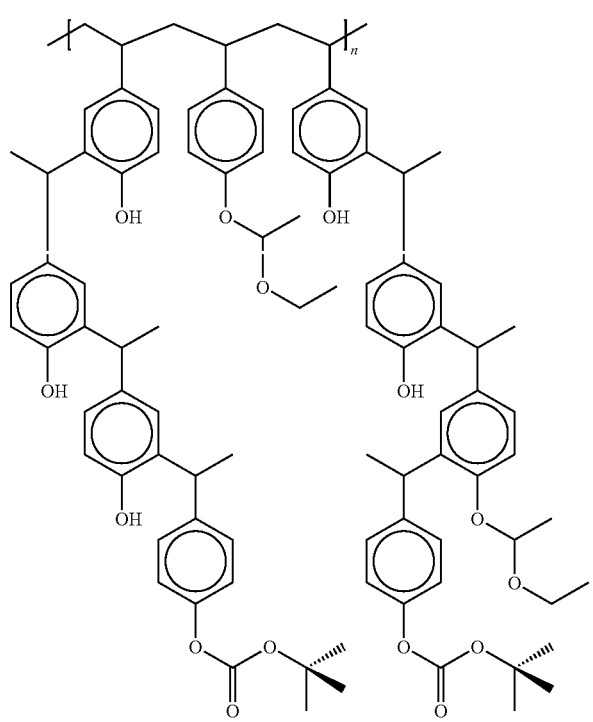

(IV)

In the above structures I, II, III, and IV, n is from about 1 to about 10, and generally from about 2 to about 6.

The present invention, in part, provides a novel DPHS and a novel process for preparing DPHS having a novolak type structure which comprises the steps of (i) supplying a solution of methanol containing 4-hydroxyphenylmethylcarbinol (HPMC), (ii) subjecting said solution to an acid catalyzed displacement reaction for a sufficient period of time and under suitable conditions of temperature and pressure to convert substantially all of said carbinol to 4-hydroxyphenylmethylcarbinol methyl ether in solution, and (iii) polymerizing said ether containing solution in the presence of a suitable acid catalyst for a sufficient period of time and under suitable conditions of temperature and pressure to form a novolak type polymer consisting of DPHS.

More specifically, the present invention is directed, in part, to a unique, cost-efficient process for preparing a novolak type polymer without any of the prior art disadvantages and wherein the polydispersity of the new material is surprisingly low, e. g. less than 2.0 and generally about 1.5 to about 1.9.

It has unexpectedly been found that the use of a freshly supplied carbinol such as HPMC cannot be used directly to form the a DPHS having a novolak type structure, and this is contrary to the disclosures set forth in U.S. Pat. Nos. 5,554,719 and 5,565,544. It has been found that if a freshly supplied carbinol such as HPMC is not treated as set forth in the present invention and before polymerization, the resultant polymer is a gummy mass which is poor in color and hard to further treat to arrive at the desired end product, i.e. the DPHS novolak type polymer. Thus, it is essential and critical that HPMC be converted to its ether form before the material is polymerized.

The carbinol such as HPMC is subject to an acid catalyzed displacement reaction in order to convert it to its methyl ether form. This step can be carried out by use of an acid ion exchange resin such as Amberlyst-15 (Rohm and Haas product) or M31 (Dow Product). The HPMC material is supplied in a methanol solvent wherein the HPMC is dissolved therein. The concentration of HPMC in solution is from about 1% to about 50% by weight, preferably from about 15% to about 30% by weight. This conversion takes place by merely contacting said HPMC containing methanol solution with, e.g. the A-15 material either by running the solution a fixed bed of A-15 or merely mixing the two materials together for a sufficient period of time and under suitable conditions of temperature and pressure. The temperature of the conversion step is not critical and can be from about 0 C to about 100 C and the pressure is also not critical, but can be from about 0 psig to about 10 psig, or even conducted under vacuum. The conversion time is also not critical and is long as necessary to convert the HPMC to the methyl ether form. This time can be as long as several days at room temperature to as short as 24 hours at 45 C. The critical factor in this conversion step is the conversion must convert substantially all of the HPMC to the methyl ether form before the polymerization step takes place. It is desirable that the conversion be at least 90% complete, preferably at least 95% complete.

The second step is the polymerization step which is carried out with the same methanol solvent which now contains dissolved therein the methyl ether form of HPMC. This polymerization step is conducted with the use of a suitable acid catalyst under suitable conditions of temperature and pressure to form the desired end novolak product.

The catalyst employed in the present invention process is critical and is selected from the group $H_2SO_4$, HCl, $AlCl_3$, $H_3PO_4$, oxalic acid, $SnCl_2$, $BF_3$, $BBr_3$, $BCl_3$, para-toluene sulfonic acid, and methane sulfonic acid. Thus, Lewis acids and protic acids having a pKa of less than about 4.75 are suitable.

The catalyst is used in any amount in order to facilitate the reaction, i.e. polymerization, to yield the DPHS which has a novolak type structure. Such amounts generally are from about one part per million (ppm) to about 100,000 ppm, or higher.

The temperature employed in the polymerization is generally less than about 120° C., more specifically from about 0° C. to about 120° C. The reaction pressure may be subatmospheric, atmospheric, or superatmospheric.

The length of time which this polymerization step is conducted is not critical and the only requirement is that the polymerization be conducted for a period of time sufficient to form PHS having a novolak type structure. Generally, this period is at least five minutes and may be as long as 25 hours.

After the polymerization of the reaction mixture (i.e. acid catalyst+carbinol+any nucleating agent), the desired end product (DPHS) is recovered from the reaction product and the residual fraction containing any unreacted carbinol methyl ether can be recycled as part of the starting material for the next cycle. The end product (DPHS) may be recovered from the reaction product by any method; for example, it can be separated from the fraction containing the unreacted carbinol methyl ether by, e.g. precipitation in water followed by filtration, or any other suitable technique. For example, an electronic grade of DPHS can be produced containing low ppb metals by removal of the acid with a basic ion exchange resin followed by removal of the metals by acid ion exchange resin . It is also within the scope of the present invention to utilize a nucleating agent like a seed monomer in order to prepare the reaction mixture. Such material does not have to be a carbinol nor does it have to contain any hydroxy groups. Such nucleating agents may include, without limitation, the substituted phenols and substituted triarylalkyls, and other polyphenolics such as THPE.

It is also within the scope of the present invention to employ a chain terminating agent after the polymerization step. Any type of chain terminating agent may be used as long as there is no substantial adverse effect on the novolak structure of the DPHS formed.

It is also within the scope of the present invention that the DPHS may be recovered by other methods in the art such as by spray drying.

In another part of the present invention, there is provided a process for preparing the new BDPHS. The DPHS in the alcoholic solvent such as methanol, described above, can be subjected to a solvent swap and then reacted with either a vinyl ether and/or a dialkyl dicarbonate to form the BDPHS. Otherwise, the DPHS can be recovered from the reaction medium as described above and then reacted with a vinyl ether and/or a dialkyl dicarbonate in a suitable solvent; in either case, the final reaction medium is a photoresist compatible solvent. The first method utilizes a solvent swap step.

In this step, the DPHS is solvent exchanged with an aprotic/organic solvent which is a photoresist compatible (PC) solvent, and the alcoholic solvent is removed by distillation. This PC solvent is at least one member selected from glycol ethers, glycol ether acetates and aliphatic esters having no hydroxyl or keto group. Examples of the solvent include glycol ether acetates such as ethylene glycol monoethyl ether acetate and propylene glycol monomethyl ether acetate (PGMEA) and esters such as ethyl-3-ethoxypropionate, methyl-3-methoxypropionate, among which PGMEA is preferred. These solvents may be used alone or in the form of a mixture thereof.

Further examples of the third solvent include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coaling whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the solvent is used in amounts of about 300 to 2,000 parts, preferably about 400 to 1,000 parts by weight per 100 parts by weight of the solids in the chemically amplified positive resist composition. The concentration is not limited to this range as long as film formation by existing methods is possible.

The hydroxyl containing DPHS in solution (i.e. PC solvent) from above is then subjected to an additional reaction to provide said polymer with protective or blocking groups (sometimes referred to as acid labile groups) in order to protect the functional/hydroxyl groups. In some cases, this blocking can be either substantiality blocked or partially blocked. In this step, the DPHS in solution is reacted with a vinyl either compound and/or a dialkyl dicarbonate in the presence of a catalyst in the PC solvent. When the DPHS is reacted with the vinyl ether, it is done in the presence of an acid catalyst followed by adding a base thereto to neutralize it and thus stop the reaction; this is generally called an acetalization wherein an acetal derivatized hydroxyl containing BDPHS is formed. When the DPHS is reacted with a dialkyl dicarbonate, this is an alcoholysis by use of an anhydride (dicarbonate) in the presence of base catalyst which is used as a reaction catalyst. The blocking of the DPHS can be as high as 95% with either the vinyl ether compound (VEC) or the dialkyl dicarbonate compound (DDC), preferably from about 10% to about 90%, and more preferably, from about 15% to about 70%. When both compounds are used together as blocking compounds, the range of blocking is 20% to 70% VEC and 20% to 70% DDC. The percentage stated is based on mole % and is relative to the amount of the DPHS compound.

The vinyl ethers suitable for use a protective group include those falling within the formula

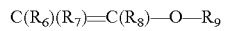

Wherein $R_6$, $R_7$ and $R_8$ are independently represent a hydrogen atom or a straight-chain, branched, cyclic or hetero-cyclic alkyl group containing 1 to 6 carbon atoms, and $R_9$ represents a straight-chain, branched, cyclic or hetero-cyclic alkyl or aralkyl group containing 1 to 10 carbon atoms which may be substituted with a halogen atom, an alkoxy group aralkyl oxycarbonyl group and/or alkyl carbonyl amino group.

The vinyl ether compounds represented by the general formula, described above include vinyl ethers such as methyl vinyl ether, ethyl vinyl ether, n-butyl vinyl ether, tert-butyl vinyl ether, 2-chloro-ethyl vinyl ether, 1-methoxyethyl vinyl ether, 1-benzyloxyethyl vinyl ether etc.; and isopropenyl ethers such as isopropenyl methyl ether, isopropenyl ethyl ether etc.

Preferable examples of cyclic vinyl ethers include 3,4-dihydro-2H-pyran etc., and preferable examples of divinyl ethers include butanediol-1,4-divinyl ether, ethylene glycol divinyl ether, triethylene glycol divinyl ether etc.

These vinyl ether compounds can be used alone or in combination thereof. The vinyl ether compounds in total are used preferably in a ratio of 0.1 to 0.7 mol equivalent to the phenolic hydroxyl or carboxyl group of the alkali-soluble polymer having phenolic hydroxyl or carboxyl group.

Preferable examples of the dialkyl dicarbonate used in this part of the present invention include di-tert-butyl dicarbonate. As with the vinyl ether compounds, the amount of the dialkyl dicarbonate used is preferably 0.1 to 0.7 mol equivalent to the phenolic hydroxyl or carboxyl group of the DPHS.

In this part of the present invention, at least one vinyl ether compound and at least one dialkyl dicarbonate can be used simultaneously for protection of the DPHS.

If the BDPHS to be synthesized is used as a component of a resist composition exposed with e.g KrF eximer laser radiation, it is preferable to use a catalyst showing no absorption at 248 nm i.e. the exposure wavelength of KrF eximer laser. Accordingly, when an acid is used as the reaction catalyst, the acid is not to have a benzene ring preferably. Examples of acids which can be used as the reaction catalyst in the present invention include mineral acids such as hydrochloric acid, sulfuric acid etc., organic sulfonic acids such as methanesulfonic acid, camphorsulfonic acid etc. or halocarboxylic acids such as trifluoroacetic acid, trichloroacetic acid etc. The amount of the acid used is preferably 0.1 to 10 mmol equivalents to the phenolic hydroxyl or carboxyl group of the DPHS.

In the case where (+/−) camphorsulfonic acid is used as the reaction catalyst in the form of solution thereof in propylene glycol monomethyl ether acetate, if said solution is heated or stored for a long period of time, the propylene glycol monomethyl ether acetate is hydrolyzed to generate propylene glycol monomethyl ether (PGME) by which the reaction is significantly inhibited. Accordingly, the solution of (+/−) camphorsulfonic acid in propylene gycol monomethyl ether acetate should be prepared just before use.

When a dialkyl dicarbonate is used as a compound to he reacted with the DPHS, a base is used as the reaction catalyst, while when a vinyl ether compound is used as a compound to be reacted with the DPHS, a base is used as the reaction stopper. As these bases, usual bases which are optically decomposable or not decomposable and are used as conventional additives in chemically amplified resists can be preferably used. Examples of these bases include ammonia, organic amines such as triethylamine, dicyclohexyl methylamine, etc.; ammonium hydroxides represented by tetramethylammonium hydroxide (TMAH), sulfonium hydroxides represented by triphenylsulfonium hydroxide, iodonium hydroxides represented by diphenyliodonium hydroxide and conjugated salts of these iodonium hydroxides, such as triphenylsulfonium acetate, triphenylsulfonium camphonate, triphenylsulfonium camphorate etc. These reaction base catalysts or reaction stoppers are preferably those which when formed into a resist composition, do not have influence on resist sensitivity, and in particular, optically decomposable bases are preferable. When the amine is present in the resist composition, attention should be paid because sensitivity may be lowered. Further, inorganic bases are not preferable because many of them contain metal ions that contaminate the substrate such as silicon wafer etc. If the BDPHS is neither isolated nor purified according to the method for preparing a resist composition, the main cause for instability of the BDPHS in the step of isolation and purification thereof can be eliminated. If a base is used as the reaction stopper, the stability of the BDPHS is further improved, and even in the case of the polymer having acetate as a protective group, its stability for 2 months or more at room temperature is confirmed.

The conditions for reacting the DPHS having a phenolic hydroxyl or carboxyl group with the vinyl ether compound or the dialkyl dicarbonate may be the same as in the prior art, and the reaction may be conducted under the same conditions as in the prior art. In this reaction, if water is present in the reaction system, the vinyl ether is decomposed to formaldehyde and alcohol, and the degree of protection by the vinyl ether compound becomes lower than the set value. As the drop of the degree of DPHS has a significant effect on the thickness loss of the resist film in developer, the moisture content should be minimized in the reaction system preferably. That is, if the moisture content in the reaction system is controlled to be as low as possible, the degree of protection can be in a certain narrow range, to significantly reduce variations in degrees of protection as compared with the conventional reaction. Accordingly, the moisture content of the reaction solution before the reaction should be measured by Karl Fischer method in order to confirm that the moisture content is less than about 5,000 ppm, preferably less than about 1,000 ppm. For example, if the moisture content is more than 5,000 ppm, attention should be paid such that the degree of protection is within a set value, for example by increasing the amount of the vinyl other compound as necessary. The reaction temperature and reaction time are e.g. 25° C., and 6 hours respectively, but if the protective group is ketal, are e.g. 0° C. and 2 hours respectively.

If the BDPHS is protected by both a vinyl ether compound and a dialkyl dicarbonate, usually the BDPHS is subjected to protection reaction with the vinyl ether compound in the presence of an acid catalyst and then subjected to protection reaction with the dialkyl dicarbonate in the presence of a base catalyst.

The usable base includes radiation-sensitive bases or usual bases not sensitive to radiation. These bases are not necessarily required for resist formulation, but because their addition can prevent the deterioration of pattern characteristics even in the case where the treatment step is conducted with delay, so their addition is preferable. Further, their addition also results in improvements in clear contrast.

Among radiation-sensitive base compounds suitable as bases, particularly preferable examples include e.g. triphenylsulfonium hydroxide, triphenylsulfonium acetate, triphenylsulfonium phenolate, tris-(4-methylphenyl) sulfonium hydroxide, tris-(4-methylphenyl)sulfonium acetate, tris-(4-methylphenyl)sulfonium phenolate, diphenyliodonium hydroxide, diphenyliodonium acetate, diphenyliodonium phenolate, bis-(4-tert-butylphenyl)iodonium hydroxide, bis-(4-tert-butylphenyl)iodonium acetate, bis-(4-tert-butylpheny)iodonium phenolate etc.

Further, the base compounds not sensitive to radiation include e.g. (a) ammonium salts such as tetramethylammonium hydroxide, tetrabutylammonium hydroxide etc., (b) amines such as n-hexylamine, dodecylamine, aniline, dimethylaniline, diphenylamine, triphenylamine, diazabicyclooctane, diazabicycloundecane etc., and (c) basic heterocyclic compounds such as 3-phenylpyridine, 4-phenylpyridine, lutidine and 2,6-di-tert-butylpyridine.

These base compounds can be used alone or in combination thereof. The amount of the base compound added is determined according to the amount of the photo acid-generating compound and the photo acid-generating ability of a photoacid generator. Usually the base compound is used in a ratio of 10 to 110 mol %, preferably 25 to 95 mole % relative to the amount of the photo acid-generating compound.

In this step of the present invention relating to the preparation of the BDPHS, the step of inactivating the acid catalyst by use of the base is an important step. That is, after the above described reaction is finished, the base (for example triphenylsulfonium acetate or the like) is added whereby the acid catalyst is neutralized and inactivated to stop the reaction, so that the BDPHS solution having storage stability can be obtained. Theoretically, addition of the base in an equivalent amount to the acid is sufficient to inactivate the acid, but because storage stability can be further secured by adding about 10% excess base, addition of about 1.1 equivalents of the base to 1 equivalent of the acid is preferable. This excess base will be taken into consideration in order to determine the amount of another base added as an additive for preparing the resist.

It is also feasible in this neutralization step to use an ion exchange material as previously mentioned herein before.

If one so desires to then prepare the final resist composition, it is prepared without isolating the resist material by directly adding to the resist material solution (prepared as described above), a photoacid generating compound capable of generating an acid upon exposure to actinic radiation (photoacid generator) and if necessary a base and additives for improvement of optical and mechanical characteristics, a film forming property, adhesion with the substrate, etc. optionally in the form of a solution. The viscosity of the composition is regulated by addition of solvent, if necessary. The solvent used in preparing the resist composition is not necessarily limited to the type of solvent having been used above, and it is possible to use any other solvent which is conventionally used in preparation of a resist composition. Further, any photo acid-generating compounds and other addcitives, which are used conventionally in chemically amplified resists, can also be used. The total solid content in the resist composition is preferably in the range of 9 to 50% by weight, more preferably 15 to 25% by weight, relative to the solvent.

The photoacid generator is a compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used atone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxy-phenyl)phenylsulfonium, tris(4-tert-butoxyphenyl) sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl) phenylsulfonium, tris(3,4-di-tert-butoxyphenyl)sulfonium, diphenyl(4-thiophenoxyphenyl)sulfonium, (4-tert-butoxycarbonyl-methyloxyphenyl)diphenylsulfonium. tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyl-dimethylsulfonium, trimethylsulfonium, 2-oxocyclohexylcyclohexyl-methylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluorooethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodinium cations are arytiodonium cations including diphenyliodinium, bis(4-tert-butylphenyl)iodonium, 4-tert-butoxyphenylphenyliodonium, and 4-methoxyphenylphenyIodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bis-sulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazotmethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2,2,1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate, Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group. Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexylsulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime.

Of these photoacid generators, the sulfonium salts, bissulfonyldiazomethane compounds, and N-sulfonyloxyimide compounds are preferred.

While the anion of the optimum acid to be generated differs depending on the ease of scission of acid labile groups introduced in the DPHS, an anion which is nonvolatile and not extremely diffusive is generally chosen. The preferred anions include benzenesulfonic acid anions, toluenesulfonic acid anions, 4,4-toluenesulfonyloxybenzenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions.

In the chemically amplified positive resist composition, an appropriate amount of the photoacid generator is 0 to 20 parts, and especially 1 to 10 parts by weight per 100 parts by weight of the solids in the composition. The photoacid generators may be used alone or in a mixture of two or more. The transmittance of the resist film can be controlled by using a photoacid generator having a low transmittance at the exposure wavelength and adjusting the amount of the photoacid generator added.

In conjunction with the all steps set forth above, it is critical that all steps be conducted on an anhydrous basis, i.e. wherein the water level is less than about 5,000 parts per million (ppm), in order to avoid possible side reactions and provide a mechanism to provide a convenient and direct route to a resist composition without having to isolate the BDPHS product and then carry out additional processing steps.

In addition to the use of DPHS (with a novolak-type structure) and/or BDPHS, in the microelectronic chemicals market, such DPHS and/or BDPHS can be employed in standard novolak applications such as varnishes, aniline printing inks, raw materials for epoxy resins, copying paper, tackifiers for rubber, and crude oil separators and other applications as stated herein.

The following specific examples are supplied for the purpose of better illustrating the invention. These examples are not intended, however, to limit or restrict the scope of the invention in any way and should not be construed as providing conditions, parameters, or values which must be utilized exclusively in order to practice the present invention.

EXAMPLE 1

4-Hydroxyphenylmethylcarbinol Methyl Ether (HPMEE) Synthesis

To 15 gms of methanolic solution containing 22.2% 4-hydroxyphenylmethylcarbinol (HPMC) was added 0.45 gms of Amberlyst A-15 acid ion exchange resin. This mixture was allowed to stand for 72 hours at room temperature. HPLC analysis indicates that the resulting solution contains only 0.21% HPMC (99% conversion) with the remainder being HPME. This material thus produced is suitable for use as a raw material in the preparation of the DPHS polymer.

Polymerization of 4-Hydroxyphenylmethylcarbinol Methyl Ether (HPME), Production of DPHS Polymer in Methanol Solution To a 500 ml flask fitted with a nitrogen inlet, mixer, temperature indicator and controller, and reflux condenser was added 226 gms of methanol solution containing 30.4% HPME (68.7 gms HPME) raw material. Using solvent distillation 131 gins of methanol was removed rendering a solution containing 72.3% HPME in methanol.

The resulting solution was cooled to room temperature. With stirring and under nitrogen, 1.4 gms of aqueous 10% $H_2SO_4$ (catalyst) was added at 30° C. The mixture was heated over a 30 minute period to 35° C. and a second equal portion of catalyst was added. This process was repeated three more times at which time 7.0 gm of acid catalyst had been added with a resulting temperature of 50° C. over a two hour period. The polymerization mixture was then increased to 65° C., reflux temperature, at which time the mixture color was noted to be pink turning amber thereafter. Reflux was allowed to continue for 26 hours after which time the reaction mixture was cooled to 27° C.

The resulting reaction mixture was diluted with methanol to give a solids concentration of about 30% which was slowly fed into demineralized water (1 part by weight methanol solution to 10 parts demineralized water) to give a precipitated polymer product. The precipitated material was filtered and washed three times with 125 gms of fresh demineralized water.

The wet-cake thus obtained was dried under vacuum at 40° C. until the moisture content was about 1% or less. This polymer was observed to have a GPC molecular weight of 4528 MW, a polydispersity of 1.6, and was of light pink color.

EXAMPLE 2

Comparative

In a similar polymerization run using a raw material containing significant quantities of HPMC in the presence of HPME, a polymeric material completely unsatisfactory for commercial purposes was obtained. This undesirable material was dark blue in color and tacky upon vacuum drying. This material was also very difficult to filter and wash. This comparative example is similar to those examples 1-11 set forth in U.S. Pat. Nos. 5,554,719 and 5,565,544.

It is to be understood that the remarks above contain some theory as to the formation of DPHS with a novolak type structure; however, Applicant does not wish to be so limited.

EXAMPLE 3

50% Acetal Blocked DPHS

To a four neck three litter round bottom flask equipped with mechanical stirrer, nitrogen purge inlet and outlet, distillation column, condenser and a receiver, 245 g (2.04 moles as phenol OH equivalents) of DPHS and PGMEA, 617 g were charged. The mixture was stirred under nitrogen at 25° C. to a homogeneity and then PGMEA was distilled at 50° C. at 10 torr to remove residual water to less than 300 ppm. The solution was cooled to 5° C. and a solution of trifluoroacetic acid, 0.5 g in PGMEA 3 g was added under nitrogen purge and stirring. To the solution, ethylvinylether, 73.6 g, 1.02 mole, 50 mole equivalent to phenolic OH on DPHS was added dropwise at 5° C. under nitrogen with stirring. The mixture was stirred at 5° C. for 3 hr. and at 25° C. for 10 hr.

The solution was then applied to a column (25 mm diameter and 250 mm length) containing IRA96 in PGMEA at 8 ml/min. to remove the catalyst. The blocking level was determined to be 51 mole % by C13 NMR, Mw=4,400, PD=1.80 by GPC, TFAA<3 ppm. 51 mole % acetal blocked DPHS, 675 g at 43.5% solid in PGMEA (92.1% yield) was obtained.

EXAMPLE 4

40% Acetal Blocked DPHS

To a four neck three liter round bottom flask equipped with mechanical stirrer, nitrogen purge inlet and outlet, distillation column, condenser and a receiver, 258 g (2.15 moles as phenol OH equivalents) of DPHS and PGMEA, 628 g were charged. The mixture was stirred under nitrogen at 25° C. to a homogeneity and then PGMEA was distilled at 50° C. at 10 torr to remove residual water to less than 300 ppm. The solution was cooled to 5° C. and a solution of trifluoroacetic acid, 0.5 g in PGMEA 3 g was added under nitrogen purge and stirring. To the solution, ethylvinylether, 62 g, 0.86 mole, 40 mole equivalent to phenolic OH on DPHS was added dropwise at 5° C. under nitrogen with stirring. The mixture was stirred at 5° C. for 3 hr. and at 25° C. for 10 hr.

The solution was then applied to a column (25 mm diameter and 250 mm length) containing ERA96 in PGMEA at 8 ml/min. to remove the catalyst. The blocking level was determined to be 43 mole % by C13 NMR, Mw=4,400, PD=1.79 by GPC, TFAA=4.19 ppm. 43 mole % acetal blocked DPHS, 647 g at 45.1% solid in PGMEA was obtained (91.2% yield)

EXAMPLE 5

24% t-Boc Blocked DPHS

To a four neck three liter round bottom flask equipped with mechanical stirrer, nitrogen purge inlet and outlet, distillation column, condenser and a receiver, 419 g (3.49 moles as phenol OH equivalents) of DPHS, Lot 8007A and PGMEA, 1753 g were charged. The mixture was stirred under nitrogen at 25° C. to a homogeneity and then PGMEA was distilled at 50° C. at 10 torr to remove residual water to less than 300 ppm. The solution was cooled to 40° C. and a solution of Dimethylaminopyridine (DMAP), 0.6 g in PGMEA 6 g was added under nitrogen purge and stirring. To the solution, Di-t-butyl-dicarbonate (DBDC), 228.6 g, 1.05 mole, 30 mole equivalent to phenolic OH on DPHS was added at once at 40° C. under nitrogen with stirring. The mixture was stirred at 40° C. for 3 hr. and at 25° C. for 10 hr.

The solution was then applied to a column (25 mm diameter and 250 mm length) containing MAC-3 in PGMEA at 8 ml/min. to remove the catalyst. The blocking level was determined to be 24 mole % by C13 NMR, Mw=6,000, PD=1.65 by GPC, DMAP, 92 ppm. 24 mole % t-Boc blocked DPHS 1,253 g at 39.0% solid in PGMEA (92% yield) was obtained.

EXAMPLE 6

27% t-Boc Blocked DPHS

To a four neck three litter round bottom flask equipped with mechanical stirrer, nitrogen purge inlet and outlet, distillation column, condenser and a receiver, 194 g (1.62 moles as phenol OH equivalents) of DPHS and PGMEA, 1,081 g were charged. The mixture was stirred under nitrogen at 25° C. to a homogeneity and then PGMEA was distilled at 50° C. at 10 torr to remove residual water to less than 300 ppm. The solution was cooled to 40° C. and a solution of Dimethylaminopyridine (DMAP), 0.3 g in PGMEA 3 g was added under nitrogen purge and stirring. To the solution, Di-t-butyl-dicarbonate (DBDC), 141 g, 0.65 mole, 40 mole equivalent to phenolic OH on DPHS was added at once at 40° C. under nitrogen with stirring. The mixture was stirred at 40° C. for 3 hr. and at 25° C. for 10 hr.

The solution was then applied to a column (25 mm diameter and 250 mm length) containing MAC-3 in PGMEA at 8 ml/min. to remove the catalyst. The blocking level was determined to be 27 mole % by C13 NMR, Mw=6,200, PD=1.63 by GPC, DMAP, 20 ppm. 27 mole % t-Boc blocked DPHS 776 g at 32.4% solid in PGMEA (97.2% yield) was obtained.

EXAMPLE 7

23% Acetal and 9% t-Boc Blocked DPHS

To a four neck three litter round bottom flask equipped with mechanical stirrer, nitrogen purge inlet and outlet, distillation column, condenser and a receiver, 413 g (3.44 moles as phenol OH equivalents) of DPHS and PGMEA, 1967 g were charged. The mixture was stirred under nitrogen at 25° C. to a homogeneity and then PGMEA was distilled at 50° C. at 10 torr to remove residual water to less than 300 ppm. The solution was cooled to 5° C. and a solution of trifluoroacetic acid, 0.5 g in PGMEA 3 g was added under nitrogen purge and stirring. To the solution, ethylvinylether, 66 g, 0.92 mole, 26.6 mole equivalent to phenolic OH on DPHS was added dropwise at 5° C. under nitrogen with stirring. The mixture was stirred at 5° C. for 3 hr. and at 25° C. for 10 hr.

The solution was then applied to a column (25 mm diameter and 250 mm length) containing IRA96 in PGMEA at 8 ml/min. to remove the catalyst.

The solution was cooled to 40° C. and a solution of Dimethylaminopyridine (DMAP), 0.6 g in PGMEA 6 g was added under nitrogen purge and stirring. To the solution, Di-t-butyl-dicarbonate (DBDC), 80 g, 0.37 mole, 11 mole equivalent to phenolic OH on DPHS was added at once at 40° C. under nitrogen with stirring. The mixture was stirred at 40° C. for 3 hr. and at 25° C. for 10 hr.

The solution was then applied to a column (25 mm diameter and 250 mm length) containing MAC-3 in PGMEA at 8 ml/min. to remove the catalyst.

The blocking level was determined to be 23 mole % acetal and 9 mole % t-Boc by C13 NMR, Mw=5,800, PD=1.67 by GPC, TFAA<3 ppm. Duo blocked DPHS, 1,035 g at 45.3% solid in PGMEA (97.3% yield) was obtained.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

In part, the present invention covers the following inventive ideas:

1. A process for preparing derivatized polyhydroxystyrene having a novolak type structure which comprises the steps of (a) supplying a solution of methanol containing 4-hydroxyphenylmethylcarbinol, (b) contacting said solution with an acid ion exchange resin for a sufficient period of time and under suitable conditions of temperature and pressure to convert substantially all of said carbinol to 4-hydroxyphenylmethylcarbinol methyl ether in solution, (c) polymerizing said ether containing solution in the presence of a suitable acid catalyst for a sufficient period of time and under suitable conditions of temperature and pressure to form a novolak type polymer.

2. The process as set forth in item 1 wherein said acid catalyst is a Lewis acid.

3. The process as set forth in item 1 wherein the temperature in steps (b) and (c) is from about 0° C. to about 100° C. and the pressure is from about 0 psig to about 10 psig.

4. The process as set forth in item 1 wherein the acid catalyst is a mineral acid.

5. The process as set forth in item 4 wherein the acid catalyst is sulfuric acid.

6. The process as set forth in item 1 wherein the acid catalyst is selected from the group consisting of $H_2SO_4$, HCL $AlCl_3$, $H_3PO_4$, oxalic acid, $SnCl_2$, $BF_3$, $BBr_3$, $BCl_3$, para-toluene sulfonic acid, methane sulfonic acid, trifluoroacetic acid, trichloroacetic acid and mixtures thereof.

7. A composition of matter having the following structure:

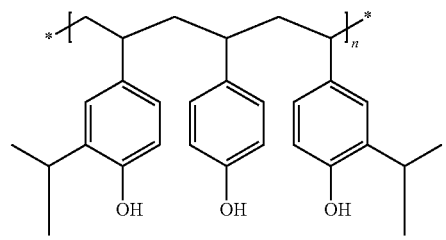

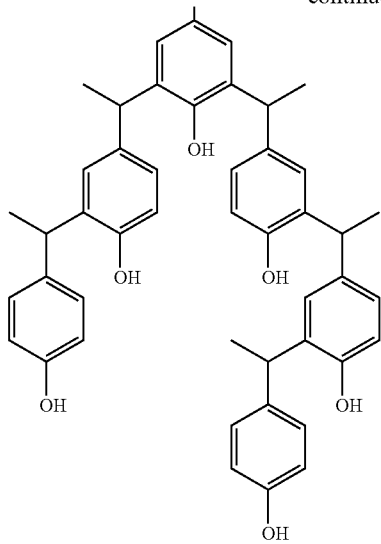
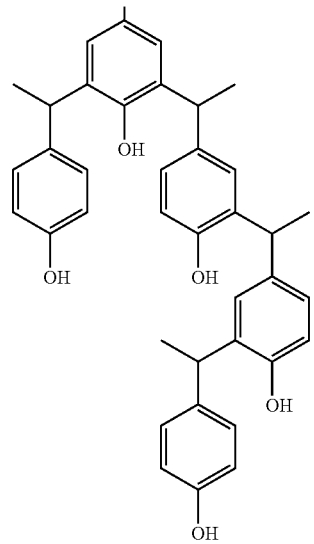

wherein n is from about 1 to about 10.

8. A composition of matter comprising a derivatized poly (4-hydroxystyrene) characterized by having from about 6% to about 40% linearity, a polydispersity of less than about 2.0, and a molecular weight of less than about 10,000.

9. A primary photoresist composition for patterning electronic circuitry based on the composition of matter set forth in item 7.

10. A curing agent for an epoxy resin based on the composition of matter set forth in item 11. A varnish incorporating the composition of matter set forth in item 7.

12. A printing ink incorporating the composition of matter set forth in item 7.

13. A tackifier for rubber incorporating the composition of matter set forth in item 7.

14. A crude oil separator incorporating the composition of matter set forth in item 7.

15. A solder mask or photoimageable coverlay for rigid or flexible printed circuit boards incorporating the composition of matter set forth in item 7.

16. An epoxy material which has been further derivatized by reaction with the hydroxy groups in the composition of matter set forth in item 7.

17. A epoxy or blocked isocyanate containing paint formulation which also has incorporated therein the composition of matter set forth in item 7.

18. A highly viscous polymer having incorporated therein the composition of matter set forth in item 7 and which acts as a viscosity modifier therefore.

19. A polymeric material having incorporated therein the composition of matter set forth in item 7 and which acts as an antioxidant therefore.

20. A process for preparing 4-hydroxyphenylmethyl-carbinol methyl ether and which comprises the steps of (i) supplying a solution of methanol containing 4-hydrophenylmethylcarbinol and (ii) contacting said solution with an acid ion exchange resin for a sufficient period of time and under suitable conditions of temperature and pressure to convert substantially all of said carbinol to the carbinol methyl ether.

What is claimed is:

1. A photoresist composition comprising a blocked derivatized poly (4-hydroxystyrene) characterized by having from about 5% to about 40% linearity, a polydispersity of less than about 2.0, and a molecular weight of less than about 10,000, with the proviso that said blocking is up to 95 mole % of the derivatized poly(4-hydroxystyrene).

2. A composition of matter having the following structure:

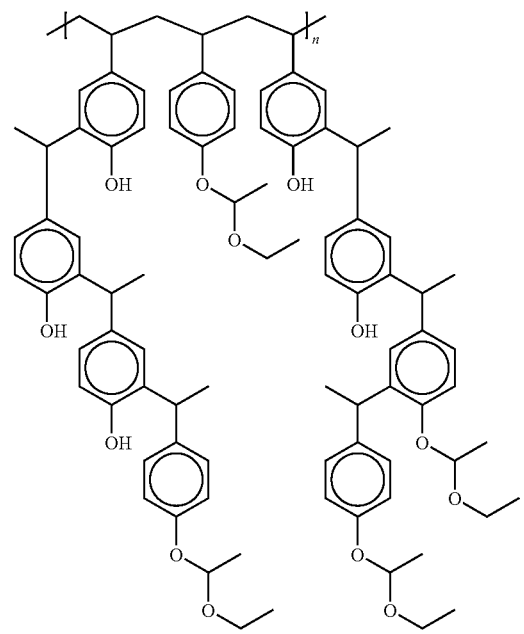

wherein n is from about 1 to about 10.

3. A composition of matter comprising a blocked derivatized poly(4-hydroxystyrene) (DPHS) characterized by having from about 5% to about 40% linearity, a polydispersity of less than about 2.0, and a molecular weight of less than about 10,000 with the proviso that said blocking is up to 95 mole % of the derivatized poly(4-hydroxystyrene).

4. The composition of matter as set forth in claim 3 wherein the DPHS is blocked by the reaction of the DPHS with a vinyl ether, a dialkyl dicarbonate, or a mixture of vinyl ether and dialkyl dicarbonate.

5. A photoresist composition containing the composition of matter as set forth in claim 2.

* * * * *